United States Patent [19]

Martinkovic

[11] 4,070,589
[45] Jan. 24, 1978

[54] HIGH SPEED-HIGH VOLTAGE SWITCHING WITH LOW POWER CONSUMPTION

[75] Inventor: David John Martinkovic, Binghamton, N.Y.

[73] Assignee: The Singer Company, Binghamton, N.Y.

[21] Appl. No.: 737,095

[22] Filed: Oct. 29, 1976

[51] Int. Cl.² ............................................. H03K 17/60
[52] U.S. Cl. ...................................... 307/246; 307/254; 307/268; 320/1; 328/67
[58] Field of Search ............... 307/246, 254, 268, 270; 328/67; 320/1

[56] References Cited
U.S. PATENT DOCUMENTS 3,555,301  1/1971  Hansen .................................. 307/246
3,968,385  7/1976  Van Tol ............................ 307/246 X Primary Examiner—John Zazworsky
Attorney, Agent, or Firm—James F. Duffy; James C. Kesterson

[57] ABSTRACT

A capacitive load is charged through a series transistor. Peak charge currents for the load are drawn from a capacitive source whose charge is constantly maintained. Rapid discharge of the capacitive load is through a semiconductor diode and a cascade of transistors which act as switching elements. Diodes across the base-emitter junction of these switching diodes provide protection against transient damage as well as reducing the time required to cut-off conduction of the transistors. A simple transistor TTL drive (+5v) operates the switch.

9 Claims, 3 Drawing Figures

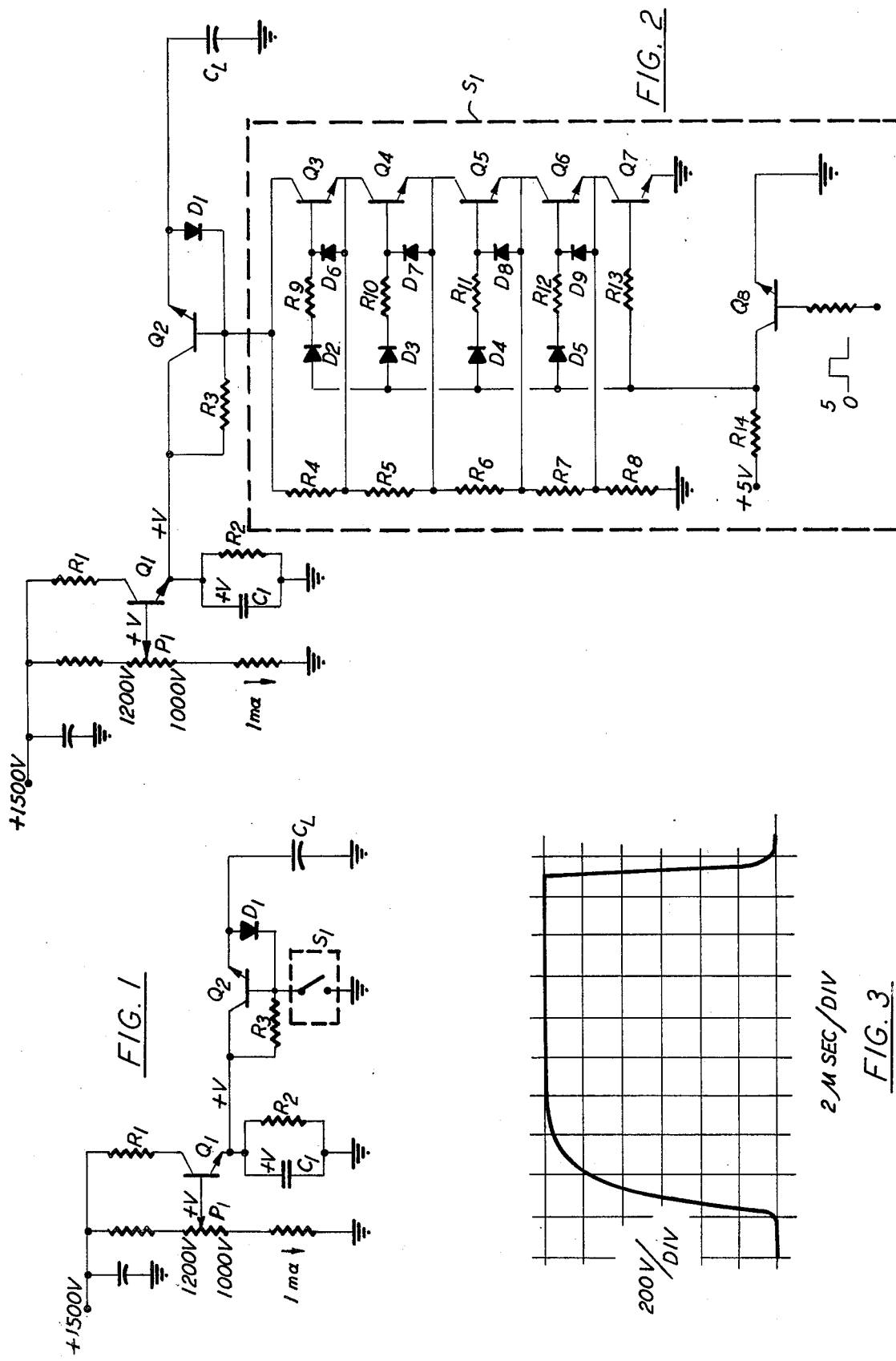

HIGH SPEED-HIGH VOLTAGE SWITCHING WITH LOW POWER CONSUMPTION

The Government has rights in this invention pursuant to contract number F33657-72-C-0639 awarded by the Department of the Air Force.

BACKGROUND OF THE INVENTION

1. Field of the Invention

The invention relates to transistorized, high speed, high voltage, high peak current switching circuits and in particular to such switching circuits when required to operate into a capacitive load.

2. Description of the Prior Art

Prior art switching devices have been primarily concerned with achieving high speed, high voltage switching while protecting the transistor switching elements from voltage breakdown. Gindi, in U.S. Pat. No. 3,007,061, teaches that low voltage transistors may be connected in cascade so as to hold off much higher voltages than the individual transistors themselves would be able to withstand.

When the switch must operate into a capacitive load the demands made upon the power supply may be great, if rapid charge of the load is required. At the first instant of charge-current flow, the load appears to the power source as a short circuit. Any resistance placed in the charging path to reduce the burden upon the power supply will increase the RC time constant of the charge path, thereby adversely affecting the time required for the load to reach full charge.

Although the average current requirements may be small, the ability to respond to peak current demands, where rapid charge of a capacitive load is necessary, often place an economic burden upon a system with respect to the specification of the power supply to be used in that system.

Picillo presents a switching circuit in U.S. Pat. No. 3,588,538 useful to rapidly discharge a capacitive load, but is not concerned with the speed at which the load is charged.

Shulka in U.S. Pat. No. 3,735,153 charges and discharges a peizoelectric crystal through current limiting charge and discharge resistors, 18 and 22 respectively. His primary objective was to provide timing control means in the base circuit of each transistor element for sequentially turning on or turning off the circuit.

Neither Picillo nor Shulka addressed a requirement for rapid charge of the load.

It shall be an object of the present invention to provide a high speed, high voltage switch capable of both rapidly charging and discharging a capacitive load.

It shall be a further object of the invention to provide a high speed charging circuit which makes minimal demands on the power supply.

Other objectives such as the provision for a simple, low power, TTL drive for transistor switch operation and transient protection of transistor switch elements will be made apparent as the invention is fully described.

SUMMARY OF THE INVENTION

A capacitive load is charged through a series transistor. Since the impedance of the charge path transistor is a function of its Beta, a low impedance, rapid charge path is created. Peak charge currents for the load are drawn from a capacitive source whose charge is constantly maintained. Rapid discharge of the capacitive load is through a semiconductor diode, and a cascade of transistors which act as switching elements. Diodes across the base-emitter junction of these switching diodes provide protection against transient damage as well as reducing the time required to cut-off conduction of the transistors. A simple transistor TTL drive (+5v) operates the switch.

BRIEF DESCRIPTION OF THE DRAWINGS

FIG. 1 is a simplified schematic of the system to rapidly charge and discharge a capacitive load.

FIG. 2 is the circuit of FIG. 1 showing the transistor switching elements in the discharge path.

FIG. 3 represents an oscillograph of the voltage across the capacitive load.

DESCRIPTION OF THE INVENTION

FIG. 1 is a simplified schematic of the invention. The discharge path for load capacitor $C_L$ is through diode D1 and switch S1 which is depicted, for conceptual purposes, merely as a SPST switch.

A source of high voltage, say, for example, 1500v, is provided to a resistive network which contains potentiometer P1. The moving contact of pot P1 is connected to the base of emitter follower Q1 and adjusted to the voltage level to which load $C_L$ is to charge. This voltage level, +V, will appear at the emitter of Q1.

Resistor R1 is connected in series with the high voltage source and the collector of Q1. Resistor R1 is selected to limit the in-rush current through Q1 when the circuit is first energized.

The parallel combination of capacitor C1 and resistor R2 is connected between the emitter of Q1 and common ground. Capacitor C1 is several orders of capacitance larger than is load $C_L$. Once C1 has charged to +V, it will act as the source of charge current for $C_L$. Resistor R2 is chosen to maintain emitter follower Q1 in a fully conducting state. About ten milliamps of current will normally flow through R1. With Q1 in full conduction, the voltage +V will be held constant at the emitter.

The emitter of Q1 is also connected to the collector of emitter follower Q2 and to one end of resistor R3. The base of Q2 provides a common junction for the other end of resistor R3, the cathode of diode D1, and one side of switch S1. The anode of diode D1 is connected to the emitter of Q2 and to the high side of capacitive load $C_L$. The low side of $C_L$ is connected to common ground as is the output of switch S1.

Assume that power has been applied to the circuit and capacitors C1 and $C_L$ have been charged to voltage level +V. At this time, if switch S1 is closed, diode D1 will have impressed across it the voltage +V and it will conduct and rapidly discharge load $C_L$, bringing the high side of $C_L$ and the emitter of Q2 to ground potential.

Since switch S1 also places the base of Q2 at ground, Q2 will be non-conducting and the discharge of capacitor C1 will be slow, being determined by the R3C1 time constant. In practice load $C_L$ will be fully discharged before there is any significant reduction in the charge stored by C1.

If switch S1 is now opened, the base of Q2 will be raised to +V by reason of bias resistor R3. Since Q2 is an emitter follower its emitter will attempt to follow the base and Q2 will rapidly come into full conduction. Because diode D1 is back-biased when +V appears at base of Q2, capacitive load $C_L$ rapidly charges through Q2, the charge path being from C1 through Q2 to $C_L$.

Capacitor C1 provides the peak current required to charge $C_L$. The only resistance in the charge path is the junction resistance $R3/\beta$ of transistor Q2. At the initial turn-on of Q2 its junction resistance is close to zero, therefore the emitter current, i.e., the charge current, rises very fast.

From the above description it is seen that the use of emitter follower Q2 provides a $\beta$ dependent, low impedance charge path for rapid charge of capacitive load $C_L$, while utilization of charge storage capacitor C1 within that low impedance charge path eliminates any requirement that the high voltage power source need respond to the high peak current demands of load $C_L$. This latter aspect provides commercial advantages since more economical, low power sources may be used with the invention than would otherwise be required. Charge on capacitor C1 is maintained by the steady conduction of transistor Q1.

A fuller description of switch S1 will now be undertaken. A low impedance conduction path between the cathode of D1 and common ground is provided by the cascade of transistors Q3 through Q7 which are series connected, emitter to collector. In shunt with transistors Q3 through Q7 is a bleeder divider network comprised of equal-valued resistors R4 through R8. Each of the transistors Q3-Q7, has one of resistors, R4-R8, connected across its collector and emitter contacts. Thus Q3-Q7 equally share the voltage which appears across the bleeder divider network, the voltage across any one transistor being less than that which would cause breakdown.

Bias resistors R9 through R13, in the base of each transistor Q3-Q7 respectively, are selected such that each transistor is biased to operate at the edge of saturation so that the base-emitter charge will be minimum.

Diodes D6-D9 are placed across the base-emitter junction of transistors Q3-Q6 respectively to protect the junction from transients which might break down the junction if occurring in a reverse bias sense. Diodes D6-D9 clamp the reverse bias voltage which may appear across the base to emitter junction to that of the diode drop, i.e., approximately 0.7v. Such diode protection is not required across transistor Q7 since its emitter is at ground potential.

Transistors Q3-Q7 are driven into conduction by a trigger applied to their base circuits. To protect the trigger circuitry from high potentials diodes D2-D5 are employed between the trigger circuit and the base bias resistors, R9-R12 respectively. Diodes D2-D5 effectively block from the trigger circuit any voltage diodes D6-D9 may couple from the emitters to the base of transistors Q3-Q6.

No diode is required in the base of Q7 since its emitter is at ground potential.

Transistor Q8 provides the drive mechanism for switch S1. With +5 volts applied to the base of Q8, its emitter at ground, it will conduct and effectively place its collector at ground potential. This will place the base circuits of transistors Q3-Q7 at ground as well. Since the emitter of Q7 is at ground it will not conduct in this circumstance. Similarly the anodes of diodes D2-D5 being at ground potential will cause these diodes to be reverse biased and no base current will flow to transistors Q3-Q6. Thus all transistors Q3-Q7 are biased off.

The collector of Q8 is connected to a +5v source through resistor R14. When a 0v signal is applied to the base of Q8 it will cut off and the collector will rise to +5v. Diodes D2-D5 will no longer be back biased.

Transistor Q7 will come into conduction pulling its collector and therefore the emitter of Q6 to zero volts, causing Q6 to come into conduction. In similar, sequential fashion, transistors Q5, Q4 and Q3 are drawn into conduction pulling the base of Q2 and the cathode of D1 to zero volts, ground potential.

At that time capacitive load $C_L$ discharges through diode D1, as previously described, and through the chain of transistors, Q3 through Q7.

The number of transistors in series in switch S1 is dictated by the magnitude of the voltage, +V, to be switched, and the maximum Vceo of the transistor type selected. Five transistors would be required, Q3-Q7 if a 2N4927 transistor having a Vceo of 250v and an $f_t > 250$ MHz is employed. If the 2N3861 transistor is used, having a Vceo of 530v and an $f_t > 50$MHz, only three transistors are required.

The only requirement placed on transistor Q8 which provides the switching signal is that it have high speed and medium current handling capacity, e.g., 2N2222.

Diodes D2-D5, in the embodiment suggested, may be type 1N4948 having a peak inverse voltage rating of 1000v and a recovery time in nanoseconds, while diodes D1 and D6-D9 are switching diodes such as the 1N914.

Transistors Q1 and Q2 may be high voltage (1500v) power transistors having a $\beta$ in the range of 15-50.

Typical of the components which may be utilized to provide one embodiment of the invention as herein disclosed are the following:

| | | | |
|---|---|---|---|
| P1 | 100 k (ohms) | R10 | 2.85 k |
| R1 | 4.87 k | R11 | 2.9 k |
| R2 | 120 k | R12 | 2.95 k |
| R3 | 38 k | R13 | 8.6 k |
| R4-R8 | 200 k | C1 | .05 mf |
| R9 | 2.8 k | $C_L$ | 27 pf |
| Q1-Q2 | Solitron Devices Inc. | | 415V101 |
| Q3-Q7 | Silicon Transistor Corp. | | 2N4927 |
| Q8 | Motorola Semiconductor Products Division | | 2N2222 |
| D1, D6-D9 | Motorola Semiconductor Products Division | | 1N914 |
| D2-D5 | Sensitron Semiconductor Corp. | | 1N4948 |

What has been described is a high speed, high voltage switch for rapidly charging and discharging a capacitive load and having minimal power requirements. A storage capacitor several orders of magnitude larger than the capacitive load is constantly maintained at full charge. Peak charging current for the load is drawn from the storage capacitor through a low impedance path comprised of a transistor operating as an emitter follower. Rapid discharge of the capacitive load is through a diode and a cascade of relatively low voltage transistors which transistors function as a switch controlled by a simple TTL drive.

FIG. 3 is indicative of the rapidity of operation of the disclosed switch invention. The fast turn-on of Q2, the low impedance charge path, the rapid cut-off of diodes D2-D5, due to their being reverse biased through protective diodes D6-D9, all contribute to the fact that the capacitive load charges to 1000v in 2 microseconds and is fully charged to 1200v (+V) within 6 microseconds. Lead dress and proximity to the load are also important.

Similarly, discharge to ground potential from the fully charged, +V level is achieved in approximately 1 microsecond due to the rapidity within which transistors Q3-Q7 come into full conduction. The turn on sequence of these transistors is so fast that no further high voltage protection is required than is already provided.

At this writing eight such devices, as herein disclosed, have been in operation at least 50 hours a week for more than 6 months. All eight switches are operated at a 36KHz rate and may be driven by a common, 100ma power supply. During that period, only one transistor, a Q2, has suffered failure.

It should be obvious to those skilled in the art that various changes and modifications may be made therein without departing from the invention. It is therefore intended to cover herein all such changes and modifications as fall within the true spirit and scope of the invention.

What I claim is:

1. A high speed-high voltage switch which consumes little power when operative to charge and discharge a capacitive load comprising:
    a storage capacitor of several orders of magnitude greater capacity than the capacitive load;
    means to continually maintain a desired charge level on said storage capacitor;
    a conduction path of variable impedance connecting said storage capacitor and said capacitive load;
    a switched discharge path operative to discharge said capacitive load while simultaneously increasing the impedance of said variable impedance conduction path; and
    drive means to establish the operating state (charge or discharge) of said high speed-high voltage switch.

2. The high speed-high voltage switch of claim 1 in which the variable impedance conduction path comprises a transistor, said impedance being a function of the $\beta$ of said transistor.

3. The high speed-high voltage switch of claim 1 in which said switched discharge path comprises:
    a series of transistors connected between said capacitive load and the discharge potential to which the load is to be drawn, the number of said transistors required being a function of the break-down voltage rating of each transistor and the voltage to be switched; and
    means to provide equal sharing among said transistors of said voltage to be switched.

4. The high speed-high voltage switch of claim 3 in which said switched discharge transistors further comprise means to protect said transistors from the adverse effect of reverse bias transients.

5. The invention of claim 4 in which said protective means comprise diodes used to clamp the reverse bias, base-emitter voltages to safe levels.

6. The high speed-high voltage switch of claim 5 further comprising means to protect said drive means from high voltages which may appear on said transistors.

7. The invention of claim 6 in which said protective means comprise diodes within the base circuit of said transistors to block high voltages which may appear on said transistor base.

8. The high-speed, high voltage switch of claim 1 in which said drive means is a simple TTL drive comprising:
    a transistor having its collector connected to a low voltage source and to said switched discharge path, its emitter to ground, and its base to a drive signal source.

9. A method for switching a capacitive load so as to charge and discharge it at high voltage levels and high speed while consuming minimal power comprising the steps of:
    storing high voltage energy within a capacitor relatively large with respect to the load;
    maintaining a continual charge on said capacitor;
    drawing charge from said capacitor to charge said load;
    drawing said charge through a variable impedance path;
    providing a switched discharge path to discharge said load while simultaneously increasing the impedance of said variable impedance charge path; and
    providing a drive signal to control the operating of said switched discharge path and of said variable impedance charge path.

* * * * *